(12) United States Patent
Lin et al.

(10) Patent No.: US 6,396,730 B1
(45) Date of Patent: May 28, 2002

(54) NON-VOLATILE MEMORY CELL AND SENSING METHOD

(75) Inventors: Chin-Hsi Lin; Chi-Ming Weng, both of Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/788,373

(22) Filed: Feb. 21, 2001

(30) Foreign Application Priority Data

Jan. 20, 2001 (TW) ........................................ 90101580 A

(51) Int. Cl.⁷ .............................................. G11C 11/22
(52) U.S. Cl. ........................................ 365/145; 365/149
(58) Field of Search ................................. 365/145, 149, 365/82, 203, 205, 207

(56) References Cited

U.S. PATENT DOCUMENTS 5,406,510 A * 4/1995 Mihara et al. ............... 365/145
5,638,318 A * 6/1997 Seyyedy ...................... 365/145
6,034,884 A * 3/2000 Jung ........................... 365/145
6,118,688 A * 9/2000 Hirano et al. ............... 365/145

* cited by examiner

Primary Examiner—Michael S. Lebentritt
Assistant Examiner—Anh Phung

(57) ABSTRACT

A ferroelectric capacitor memory cell includes two transistors coupled to two ferroelectric capacitors respectively. The two ferroelectric capacitors store complementary polarization states, which defines a single data state of memory cell. The plate line is coupled to one end of the ferroelectric capacitors. The word line is coupled to the gates of the two transistors. The bit lines are coupled to the source/drain of the two transistors. According to the present invention, the disclosed detecting scheme precharges the bit lines to logical one voltage, setting the word line and plate line to logical zero voltage, stepping the word line from the initial logical zero voltage to logical one voltage, stepping the plate line from the initial logical zero voltage to logical one voltage, enabling the sensing amplifier to sense the differential charge on the bit lines, discharging the bit lines to restore the original data.

20 Claims, 4 Drawing Sheets ns in FIG. 1 and the
NON-VOLATILE MEMORY CELL AND SENSING METHOD

FIELD OF THE INVENTION

The present invention relates to a non-volatile memory, and more particularly to a non-volatile ferroelectric capacitor memory and a method for sensing ferroelectric capacitor data in a memory cell.

BACKGROUND OF THE INVENTION

It is well known that ferroelectric material performs a hysteresis characteristic and is capable of retaining polarization state even when the applied power is removed from the material. The ferroelectric capacitor memory cell can memorize "1" or "0" using different polarization state. The field voltage can be applied across the capacitor to read the memorized data, "1" or "0", because different polarization state represents different capacitance which can be sensed by sensor device.

FIG. 1 illustrates a hysteresis curve of ferroelectrical material, wherein the abscissa represents the field voltage applied to the material and the ordinate represents the polarization of the material. If a capacitor is formed using a ferroelectric material between its plates, because of the hysteresis curve, the flow of current through the capacitor will depend on the prior history of the voltages applied to the device. If a ferroelectric capacitor is in a initial state on which zero volt is applied, point A or point D may indicate polarization. Assuming that point A in FIG. 1 indicates polarization, a positive voltage which is greater than the coercive voltage (referring to point B in FIG. 1) is applied across the capacitor, then the capacitor will conduct current and have a new polarization (referring to point C in FIG. 1) state. When the applied voltage is removed, the ferroelectric capacitor will maintain the same polarization state as shown at point D instead of returning to the state as shown at point A. A positive voltage continuously applying across the capacitor will cause a little change on the polarization. However, an enough negative voltage will cause the polarization to vary from point D to point E as indicated in FIG. 1. Once the negative voltage is removed from the capacitor, the ferroelectric capacitor will maintain the same polarization state and the curve moves to point A. Therefore, point A and point D respectively represent two different logical states when zero volt is applied across the capacitor.

Nonvolatile semiconductor ferroelectric memories can memorize "1" or "0" using different polarization state, and such polarization state will not be destroyed when the power is removed from the memory. Referring FIG. 2, is a schematic diagram of a 2T/2C memory cell 200 (two-transistors, two-capacitors). Ferroelectric memory circuits includes a word line 201, two bit lines 202 and 203 coupling to a sense amplifier 209, a plate line 208 for driving ferroelectric capacitor and a memory cell 200 including transistors 204, 205 and ferroelectric capacitors 206, 207.

The conventional detecting scheme can be divided into two types: plate line driven and bit line driven. For example, a timing diagram for the plate line driven of a 2T/2C memory cell such as cell 200 is shown in FIG. 3. Assuming that the polarization state of ferroelectric capacitor 207 is at point D in FIG. 1 and the polarization state of ferroelectric capacitor 206 is at point A in FIG. 1. At time T1, the word line 201 is stepped from the initial logical zero voltage to a logical one voltage to drive transistor 204 and 205. At time T2, the plate line 208 is pulsed to a logical one voltage. The polarization state stored in the ferroelectric capacitor 206 will be changed, from point A to point DC, a large amount of electrical charge being transferred from the ferroelectric capacitor 206 to the bit line 202. The polarization state stored in the ferroelectric capacitor 207 changes from point D to point C maintains the same polarization state, only small amount of electrical charge would be transferred from the ferroelectric capacitor 207 to the bit line 203. At time T3 the sensing amplifier 209 is enabled and the differential charge on the bit lines 202 and 203 can be sensed and converted into a valid logical state. At time T4 and T5, the original data is written into the memory cell 200 to restore the data.

On the other hand, a timing diagram for the bit line driven of is shown in FIG. 4. Assuming that the polarization state of ferroelectric capacitor 207 is at point D in FIG. 1 and the polarization state of ferroelectric capacitor 206 is at point A in FIG. 1. At time T1, the bit line 202 and 203 are precharged to a logical one voltage, usually five volts. At time T2, the word line 201 is stepped from the initial logical zero voltage to a logical one voltage to drive transistor 204 and 205. The polarization state stored in the ferroelectric capacitor 206 will be changed from point A to point CD and the polarization state in the ferroelectric capacitor 207 will be changed from point D to point C maintains the same polarization state due to the plate line 208 in the logical zero voltage. The electrical charge being transferred from the bit line 202 and 203 to the ferroelectric capacitors 206 and 207. The bit lines will exhibit different voltage due to the switched ferroelectric capacitor. At time T3 the sensing amplifier 209 is enabled and the differential charge on the bit lines 202 and 203 can be sensed and converted into a valid logical state. At time T4, the plate line 208 is pulsed to logical one voltage to restore the original data. And at time T5, the bit lines are discharged to process the next reading cycle.

The conventional detecting scheme described in above has the following problems to be resolved. The main shortcoming of the plate line driven is slow speed due to large capacitance of ferroelectric capacitor that the plate line need to drive. The two ferroelectric capacitors 206 and 207 are connected to plate line 208, and at time T2, the plate line 208 is pulsed to logical one voltage to read the data stored in memory cell 200. However, since the plate line must transition the polarization state of ferroelectric capacitor, T2 has the issues of the heavier loading for plate line, that will be the bottleneck of fast access and cycle time. And bit line driven scheme is to overcome the shortcoming, the bit line driven method do not need drive the plate line in reading cycle but the plate line also is needed to drive for write back action at time T4 to transit the connected ferroelectric capacitor polarization state. Although it gets fast access time, it has no much improvement on cycle time.

SUMMARY OF THE INVENTION

The conventional detecting scheme, plate line driven or bit line driven, for operation cycle of a 2T/2C (two-transistors, two-capacitors) and 1T/1C (one-transistor, one-capacitor) often involves a destructive read for the ferroelectric capacitor changes state from one polarization state to the other. In order to maintain the original data (original polarization state), a restore cycle is needed for restoring the original data. The time required for restoring data may reduce the operation speed.

From the foregoing, in accordance with the main purpose of this present invention, the disclosed detecting scheme may increase the operation speed.

A 2T/2C memory cell includes a first transistor coupled to a first ferroelectric capacitor, and a second transistor coupled to a second ferroelectric capacitor. Ferroelectric capacitors store complementary polarization states, which defines a single data state of memory cell. The plate line is coupled to one side of the first and second ferroelectric capacitors. The word line is coupled to the gates of the first and second transistors. The first bit line and second bit line are couples to the source/drain of the first transistor and second transistor. According to the present invention, the disclosed detecting scheme precharges the first and second bit lines to logical one voltage, setting the word line and plate line to logical zero voltage, stepping the word line from the initial logical zero voltage to logical one voltage, stepping the plate line from the initial logical zero voltage to logical one voltage, enabling the sensing amplifier to sense the differential charge on the bit lines, discharging the bit lines to restore the original data.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Without limiting the spirit and scope of the present invention, the method proposed in the present invention is illustrated with one preferred embodiment about the sensing timing diagram of 2T/2C memory cell. Skill artisans, up on acknowledging the embodiments, can apply the present invention for sensing other ferroelectric capacitor memory cell to increase the reading speed.

Figure 1:
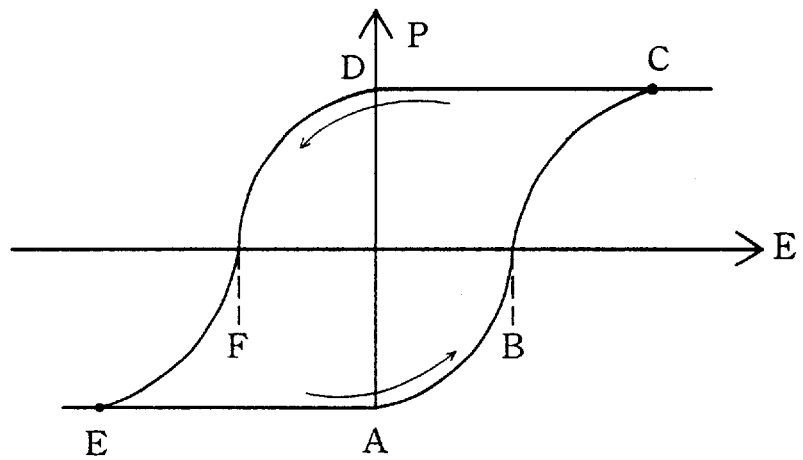
FIG. 1 depicts a hysteresis curve of a ferroelectric capacitor.
Figure 2:
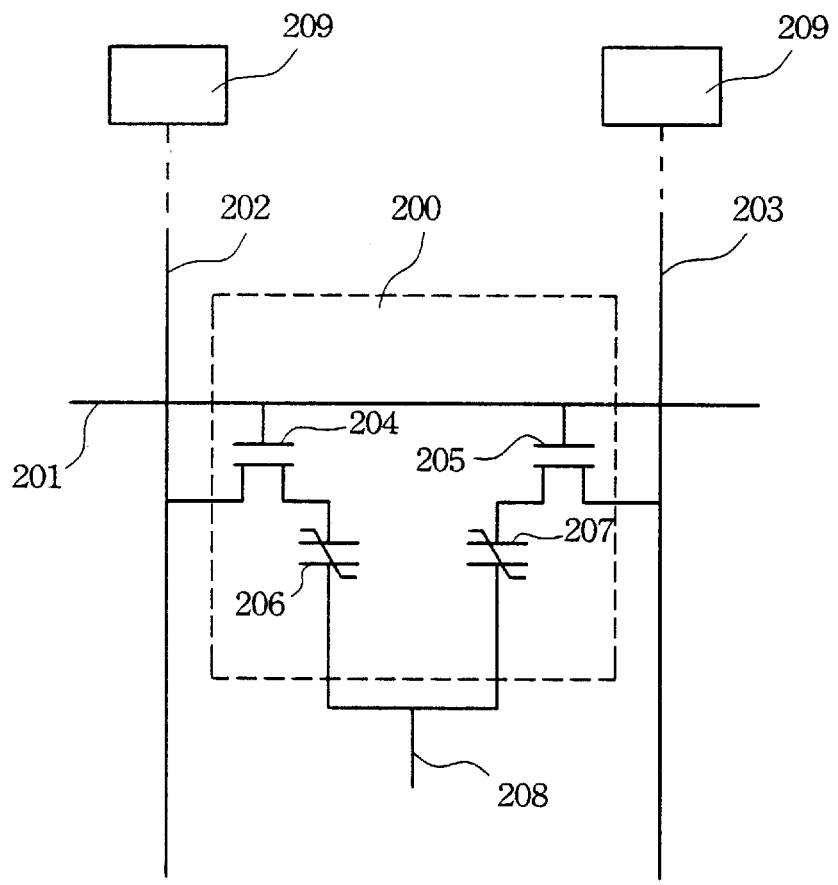
FIG. 2 depicts the circuit diagram for a conventional 2T/2C ferroelectric memory cell.

FIG. 2 illustrates a basic 2T/2C ferroelectric capacitor memory cell circuit including a transistor 204 coupled to a ferroelectric capacitor 206, and another transistor 205 coupled to a ferroelectric capacitor 207. Ferroelectric capacitors 206, and 207 store complementary polarization states, which defines a single data state of memory cell. The plate line 208 is coupled to one end of the two ferroelectric capacitors. The two transistors 204 and 205 are respectively coupled to another end of the two ferroelectric capacitors. The word line 201 is coupled to the gates of the two transistors. The bit lines 202 and 203 are respectively coupled to the source/drain of the two transistors.

Figure 5:
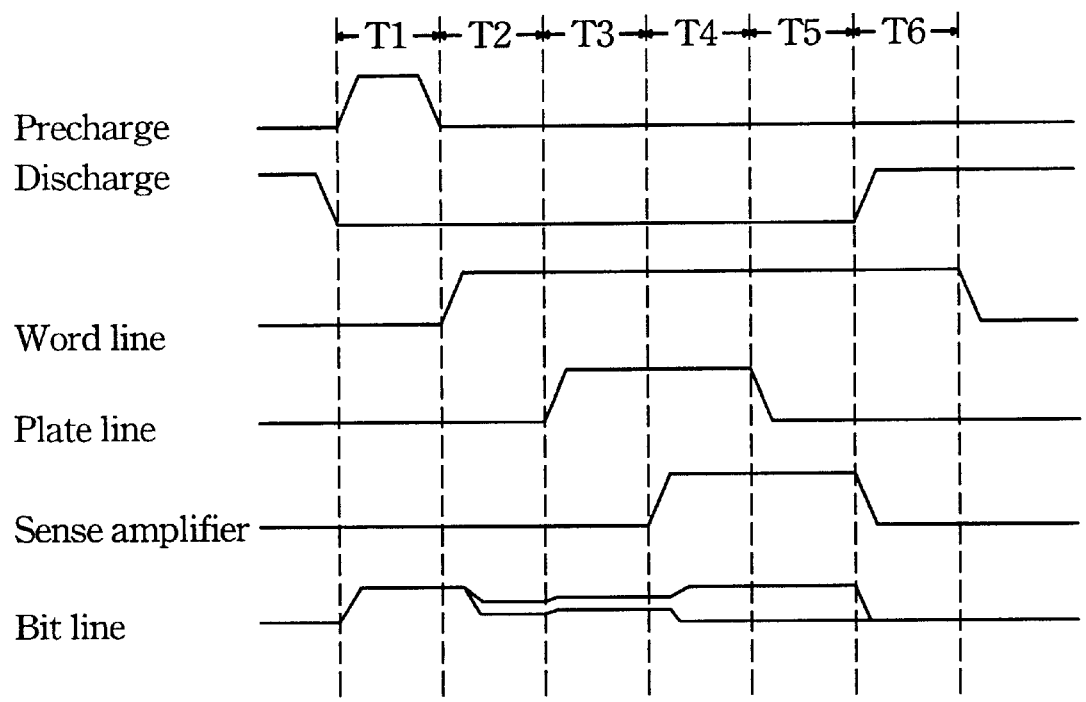
FIG. 5 depicts a sensing timing diagram according to the present invention.

FIG. 5 illustrates a sensing timing diagram according to the present invention. At time T1, the word line 201 and plate line 208 in the ferroelectric capacitor memory cell are setting in the logical zero voltage. The sensing amplifier 209 and the discharge circuit (not shown in the figure) are not enabled. The bit lines 202 and 203 are precharged to a logical one voltage, usually five volts. Assuming that the polarization state of ferroelectric capacitor 206 is at point 601 in FIG. 6 and the polarization state of ferroelectric capacitor 207 is at point 602 in FIG. 6. The stored polarization state is defined as "1".

Figure 6:
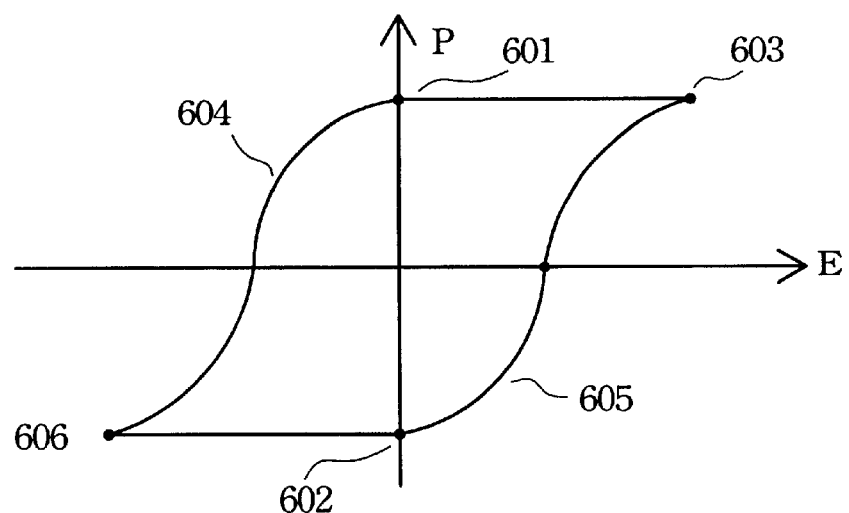
FIG. 6 depicts the change of the polarization state according to the present invention.

At time T2 of sensing timing diagram in FIG. 5, the precharge circuit (not shown in the figure) is closed and the bit lines 202 and 203 are on floating state. The word line 201 is stepped from the initial logical zero voltage to a logical one voltage, usually five volts, to drive transistor 204 and 205. The plate line 208 is maintained in logical zero voltage. The sensing amplifier 209 and the discharge circuit (not shown in the figure) are not enabled. There is a voltage across the ferroelectric capacitor 206 and 207 through the transistors 204 and 205. The polarization state of a ferroelectric capacitor 206 beginning at point 601 in FIG. 6 will follow the hysteresis curve 604 to transfer to point 603. The polarization state of a ferroelectric capacitor 207 beginning at point 602 in FIG. 6 will follow the hysteresis curve 605 to transfer to point 603 due to the applied voltage cross the ferroelectric capacitor greater than coercive voltage. The slope of the hysteresis curve in FIG. 6 represents the value of the capacitance, therefore, the ferroelectric capacitor 206 and 207 may exhibit different capacitance during moving follow the hysteresis curve. For example, the change value of capacitance of ferroelectric capacitor 206 is less than the change value of ferroelectric capacitor 207, which causes the voltage decrease range of the bit line 202 is less. The bit lines will hence exhibit different voltage due to the switched ferroelectric capacitor.

At time T3 of sensing timing diagram in FIG. 5, the precharge circuit (not shown in the figure) and the sensing amplifier 209 and the discharge circuit (not shown in the figure) are not enabled. The bit lines 202 and 203 are still on floating state. The word line 201 in the ferroelectric capacitor memory cell 200 is still maintained in a logical one voltage, usually five volts, to drive transistor 204 and 205. The plate line 208 is stepped from the logical zero voltage to the logical one voltage, usually five volts, which may cause a applied voltage across the ferroelectric capacitor 206 and 207 through the transistors 204 and 205. The across voltage value of the ferroelectric capacitor 206 is less than zero voltage due to the bit line 202 voltage value less than five volts. The polarization state of a ferroelectric capacitor 206 beginning at point 603 in FIG. 6 will follow the hysteresis curve 604 to transfer to point 601. The across voltage value of the ferroelectric capacitor 207 is also less than zero voltage. The polarization state of a ferroelectric capacitor 207 beginning at point 603 in FIG. 6, therefore, will follow the hysteresis curve 604 to transfer to point 601. The bit lines will hence exhibit different voltage due to the slope change of the hysteresis curve in FIG. 6.

At time T4 of sensing timing diagram in FIG. 5, the precharge circuit (not shown in the figure) and the discharge circuit (not shown in the figure) are not enabled. The sensing amplifier 209 is enabled and the differential charge on the bit lines 202 and 203 can be sensed. The sensed higher voltage will be brought to logical one voltage, usually five volts, and the sensed lower voltage will be brought to logical zero voltage, usually zero volts, which may read the data stored in the ferroelectric capacitor memory cell 200. The bit line 202 is in logical one voltage and the bit line 203 is in logical zero voltage according to the preferred embodiment. The word line 201 in the ferroelectric capacitor memory cell 200 is still maintained in a logical one voltage, usually five volts, to drive transistor 204 and 205. The plate line 208 is also in the logical one voltage, usually five volts, which may cause a voltage across the ferroelectric capacitor 206 and 207 through the transistors 204 and 205. The across voltage value of the ferroelectric capacitor 206 will be dropped to zero voltage due to the bit line 202 voltage value in logical one voltage, usually five volts. The polarization state of a ferroelectric capacitor 206 is at point 601 in FIG. 6. The across voltage value of the ferroelectric capacitor 207 is less than zero voltage and greater than the coercive voltage due to the bit line 203 voltage value in logical zero voltage, usually zero volts. The polarization state of a ferroelectric capacitor 207 beginning at point 601 in FIG. 6 will follow the hysteresis curve 604 to transfer to point 606.

At time T5 of sensing timing diagram in FIG. 5, the precharge circuit (not shown in the figure) and the discharge circuit (not shown in the figure) are still not enabled. The sensing amplifier 209 is enabled. The word line 201 in the ferroelectric capacitor memory cell 200 is still maintained in a logical one voltage, usually five volts, to drive transistor 204 and 205. The applied voltage in plate line 208 is removed, which may cause a voltage across the ferroelectric capacitor 206 and 207 through the transistors 204 and 205. The across voltage value of the ferroelectric capacitor 206 will be five voltage due to the bit line 202 voltage value in logical one voltage, usually five volts. The polarization state of a ferroelectric capacitor 206 beginning at point 601 in FIG. 6 will follow the hysteresis curve 604 to transfer to point 603. The across voltage value of the ferroelectric capacitor 207 is zero voltage due to the bit line 203 voltage value is in logical zero voltage, usually zero volts. The polarization state of a ferroelectric capacitor 207 beginning at point 606 in FIG. 6 will follow the hysteresis curve 605 to transfer to point 602.

At time T6 of sensing timing diagram in FIG. 5, the precharge circuit (not shown in the figure) is still not enabled. The discharge circuit (not shown in the figure) is enabled to remove the charge in the bit lines 202 and 203. The bit lines 202 and 203 will be in the zero volts. The sensing amplifier 209 is closed. The word line 201 in the ferroelectric capacitor memory cell 200 is still maintained in a logical one voltage, usually five volts, to drive transistor 204 and 205. The plate line 208 is in logical zero voltage, usually zero volts, which may cause a voltage across the ferroelectric capacitor 206 and 207 through the transistors 204 and 205. The across voltage value of the ferroelectric capacitors 206 and 207 will both be zero volts due to the bit lines 202 and 203 both in zero volts. The polarization state of a ferroelectric capacitor 206 beginning at point 603 in FIG. 6 will follow the hysteresis curve 604 to transfer to point 601. The polarization state of a ferroelectric capacitor 207 will maintain at point 602.

Figure 3:
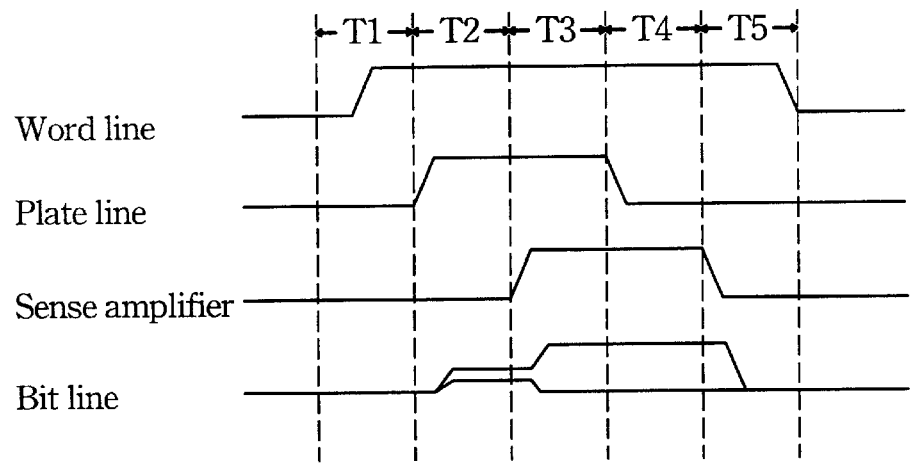
FIG. 3 depicts a sensing timing diagram according to-the plate line driven.
Figure 4:
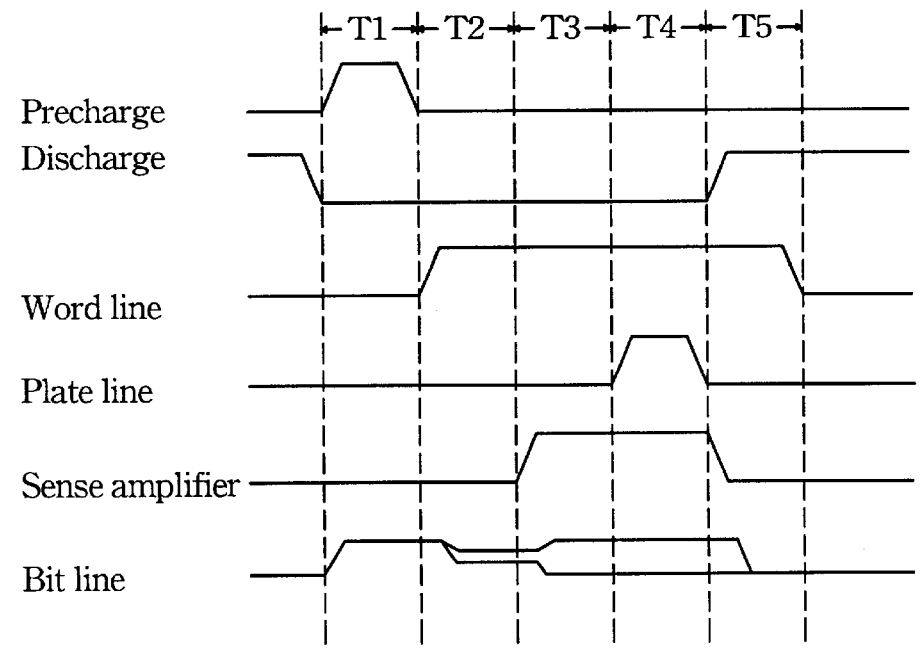
FIG. 4 depicts a sensing timing diagram according to the bit line driven.
Figure 7:
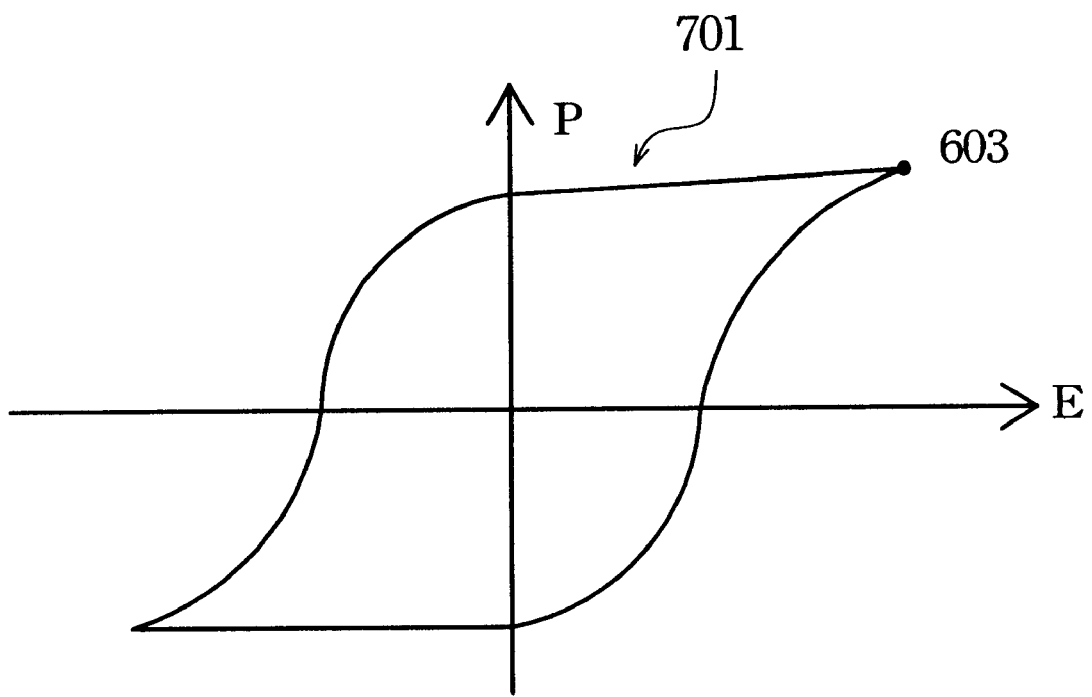
FIG. 7 depicts the change of the capacitance according to the present invention.

The plate line 208 is driven at time T3 according to the present invention while the polarization states of the ferroelectric capacitor 206 and 207 is both at point 603 in FIG. 6. Since not involving the switch of the polarization state, the sensing timing diagram according to the present invention is not similarly to the conventional sensing timing diagram according to the bit line driven or plate line driven. For example, the plate line 208 driven at time T2 in FIG. 3 according to the plate line driven will involve the switch of the ferroelectric capacitor 206, which may decrease the reading speed. On the other hand, the plate line 208 driven at time T4 in FIG. 4 according to the bit line driven will involve the switch of the ferroelectric capacitor 206, which may also decrease the reading speed. The slope of the hysteresis curve represents the capacitance. Therefore, the capacitance size of ferroelectric capacitor while the plate line 208 is driven is the slope of the line 701 in FIG. 7 according to the present invention. The charge time of ferroelectric capacitor will be described as the following equation:

$$T=R*C$$

Wherein the T represents the operation time, R represents the resistance of the plate line 208, and C represents the capacitance size of the ferroelectric capacitor connected by the plate line 208. Therefore, the charge time of ferroelectric capacitor will be reduced when the change value of ferroelectric capacitor capacitance is small, which may increase the reading speed.

As understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for sensing a ferroelectric memory device, the memory device having a word line, two bit lines coupled to a sense amplifier, a plate line, and a memory cell having two transistors and first and second ferroelectric capacitors capable of taking on first and second polarization states respectively, wherein the method comprises the steps of:

precharging said two bit lines to a logic one voltage;

stepping said word line from the initial logic zero voltage to the logic one voltage;

stepping said plate line from a logic zero voltage to a logic one voltage; and sensing the differential voltage between said two bit lines by said sense amplifier, wherein the logic one voltage is greater than the logic zero voltage and the voltage difference between the two logic voltage is larger than the coercive voltage of said first and second ferroelectric capacitors.

2. The method as claimed in claim 1, wherein the precharging of said two bit lines step further comprises setting said word line and said plate line to an initial logic zero voltage.

3. The method as claimed in claim 1, wherein after the step of precharging said two bit lines to a logic one voltage and then said two bit lines being floating.

4. The method as claimed in claim 1, wherein the step of stepping said word line from the initial logic zero voltage to the logic one voltage will transfer the first polarization state to a second polarization state of said first ferroelectric capacitor.

5. The method as claimed in claim 1, wherein the step of stepping said word line from the initial logic zero voltage to the logic one voltage will turn on said two transistors to couple respectively said two bit lines to said first and second ferroelectric capacitors.

6. The method as claimed in claim 1, wherein the step of stepping said plate line from a logic zero voltage to a logic one voltage will maintain said first and second ferroelectric capacitors in the second polarization state.

7. The method as claimed in claim 1, wherein the step of sensing the differential voltage between said two bit lines by said sense amplifier further comprises the steps of:

comparing the voltage of said two bit lines;

developing said bit line having higher voltage to the logic one voltage; and developing said bit line having lower voltage to the logic zero voltage.

8. The method as claimed in claim 1, wherein the step of sensing the differential voltage between said two bit lines by said sense amplifier will transfer the second polarization state to the first polarization state of said first ferroelectric capacitor.

9. A method for sensing a ferroelectric memory device, the memory device having a word line, two bit lines coupled to a sense amplifier, a plate line, and a memory cell having two transistors and first and second ferroelectric capacitors capable of taking on first and second polarization states respectively, wherein the method comprising the steps of:

precharging said two bit lines to a logic one voltage;

setting said word line and said plate line to an initial logic zero voltage;

stepping said word line from the initial logic zero voltage to the logic one voltage;

stepping said plate line from the initial logic zero voltage to the logic one voltage;

sensing the differential voltage between said two bit lines by said sense amplifier;

returning said plate line from the logical one voltage to the initial logic zero voltage;

discharging said two bit lines; and returning said word line from the logical one voltage to the initial logic zero voltage, wherein the logic one voltage is greater than the logic zero voltage and the voltage difference between the two logic voltage is larger than the coercive voltage of said first and second ferroelectric capacitors.

10. The method as claimed in claim 9, wherein after the step of precharging said two bit lines to a logic one voltage and then said two bit lines being floating.

11. The method as claimed in claim 9, wherein the step of stepping said word line from the initial logic zero voltage to the logic one voltage will transfer the first polarization state to the second polarization state of said first ferroelectric capacitor.

12. The method as claimed in claim 9, wherein the step of stepping said word line from the initial logic zero voltage to the logic one voltage will turn on said two transistors to couple respectively said two bit lines to said first and second ferroelectric capacitors.

13. The method as claimed in claim 9, wherein the step of stepping said plate line from a logic zero voltage to a logic one voltage will maintain said first and second ferroelectric capacitors in the second polarization state.

14. The method as claimed in claim 9, wherein the step of sensing the differential voltage between said two bit lines by said sense amplifier further comprises the steps of:

comparing the voltage of said two bit lines;

developing said bit line having higher voltage to the logic one voltage; and developing said bit line having lower voltage to the logic zero voltage.

15. The method as claimed in claim 9, wherein the step of sensing the differential voltage between said two bit lines by said sense amplifier will transfer the second polarization state to the first polarization state of said first ferroelectric capacitor.

16. The method as claimed in claim 9, wherein the step of discharging said two bit lines is to set said two bit lines to logical zero voltage.

17. A method for sensing a ferroelectric memory device, the memory device having a word line, two bit lines coupled to a sense amplifier, a plate line, and a memory cell having two transistors and first and second ferroelectric capacitors capable of taking on first and second polarization state respectively, wherein the method comprising the steps of:

precharging said two bit lines to a logic one voltage and then said two bit lines being floating;

setting said word line and said plate line to an initial logic zero voltage;

stepping said word line from the initial logic zero voltage to the logic one voltage to turn on said two transistors to couple respectively said two bit lines to said first and second ferroelectric capacitors;

stepping said plate line from the initial logic zero voltage to the logic one voltage;

sensing the differential voltage between said two bit lines by said sense amplifier and developing said bit line having higher voltage to the logic one voltage and said bit line having lower voltage to the logic zero voltage;

returning said plate line from the logical one voltage to the initial logic zero voltage;

discharging said two bit lines; and returning said word line from the logical one voltage to the initial logic zero voltage, wherein the logic one voltage is greater than the logic zero voltage and the voltage difference between the two logic voltage is larger than the coercive voltage of said first and second ferroelectric capacitors.

18. The method as claimed in claim 17, wherein the step of stepping said word line from the initial logic zero voltage to the logic one voltage will transfer the first polarization state to the second polarization state of said first ferroelectric capacitor.

19. The method as claimed in claim 17, wherein the step of stepping said plate line from a logic zero voltage to a logic one voltage will maintain said first and second ferroelectric capacitors in the second polarization state.

20. The method as claimed in claim 17, wherein the step of sensing the differential voltage between said two bit lines by said sense amplifier will transfer the second polarization state to the first polarization state of said first ferroelectric capacitor.

* * * * *